(12) United States Patent
Crowley et al.

(10) Patent No.: US 6,194,927 B1
(45) Date of Patent: Feb. 27, 2001

(54) APPARATUS AND METHOD FOR A COINCIDENT RISING EDGE DETECTION CIRCUIT

(75) Inventors: Matthew P. Crowley, San Jose; Amos Ben-Meir, Cupertino, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/314,556

(22) Filed: May 19, 1999

(51) Int. Cl.[7] ............................................. H03L 7/06
(52) U.S. Cl. ................................ 327/147; 327/163
(58) Field of Search ................................... 327/141, 147, 327/148, 149, 150, 152, 153, 156, 157, 158, 159, 161, 162, 163; 331/11, 17, 25

(56) References Cited

U.S. PATENT DOCUMENTS

| | | | |
|---|---|---|---|
| 5,561,390 | * 10/1996 | Hiiragizawa | 327/147 |
| 5,731,723 | * 3/1998 | Chen | 327/157 |
| 5,828,253 | * 10/1998 | Murayama | 327/156 |
| 5,986,485 | * 11/1999 | O'Sullivan | 327/156 |

* cited by examiner

Primary Examiner—Toan Tran
Assistant Examiner—Linh Nguyen
(74) Attorney, Agent, or Firm—Skjerven Morrill MacPherson LLP; Rita Wisor

(57) ABSTRACT

In a data processing system, a circuit for providing an even bus clock signal, $EVENB_{CLK}$, when the leading edges of the bus clock signal $B_{CLK}$ and a processor clock signal $P_{CLK}$ are coincident includes a phase-locked loop unit and a coincidence unit. The phase-locked loop unit provides $P_{CLK}$ signals that have a frequency Nx the frequency of the $B_{CLK}$ signals, where N can have an integer or a half integer value. The phase-locked loop unit includes a divide-by-M unit, where M=2N, that receives the $P_{CLK}$ signal at an input terminal and applies an output signal, $P_{CLK}/M$, to the phase detector unit of the phase-locked loop unit. The operation of the phase-locked loop results in the $B_{CLK}$ signal and the $P_{CLK}/M$ signal having an established phase relationship. The $P_{CLK}$ signal and the $P_{CLK}/M$ signal are applied to the coincidence unit, the simultaneous application of the two signals resulting in the coincidence unit providing the $EVENB_{CLK}$ signals. When N is an integer, the $P_{CLK}$ signal and the $B_{CLK}$ signal have coincident rising edges that do not coincide with a leading edge of a $P_{CLK}/M$ signal. In this situation, a delayed signal, triggered by a previous $P_{CLK}/M$ signal, is generated that is applied to the coincidence unit in place of the missing $P_{CLK}/M$ signal to provide the $EVENB_{CLK}$ signal.

31 Claims, 7 Drawing Sheets

APPARATUS AND METHOD FOR A COINCIDENT RISING EDGE DETECTION CIRCUIT

BACKGROUND OF THE INVENTION

1. Field of the Invention

This invention relates generally to electronic circuits and, more particularly, to logic circuits that generate signals in response to coincident edges of processor clock signals and bus clock signals. A data processing system typically includes a single bus clock controlling activity on the system bus and multiple processor clocks controlling internal activity in the processor components. In order to coordinate certain intercomponent activity, such as the transfer of data, the processor clocks must be synchronized with the bus clock. This synchronization is typically coordinated by the generation of a signal in the processor component identifying the coincidence of the leading edges (illustrated by rising edges herein) of the bus clock signal and the processor clock signal.

2. Description of the Related Art

In computer systems, the clock controlling the operation of the processor typically has a far higher frequency than the clock that is applied to the processing system bus. For example, in personal computer systems (PCs or Pentium™-compatible processor systems), the processor clock normally generates a clock signal with at least twice the frequency of the bus clock signal. As newer generations of processors become available for personal computing systems, the frequency of the processor clocks tend to exceed the bus clock frequencies by increasingly wide margins. In order to facilitate compatibility between the processor operating frequency and the bus operating frequency, processors are designed such that ratio of the processor clock frequency to the bus clock frequency is a whole integer or a half integer. Table 1 provides typical examples of the processor clock frequency compared to the bus clock frequency.

TABLE 1

RATIO OF THE PROCESSOR CLOCK FREQUENCY TO THE BUS CLOCK FREQUENCY

| Processor Clock Frequency | Bus Clock Frequency | Ratio |
| --- | --- | --- |
| 133 MHz | 66 MHz | 2 |
| 200 MHz | 66 MHz | 3 |
| 233 MHz | 66 MHz | 3.5 |
| 266 MHz | 66 MHz | 4 |
| 300 MHz | 66 MHz | 4.5 |

Processors frequently include synchronization circuitry, such as phase-locked loops, for establishing a timing relationship between processor clock frequency and the bus clock frequency. Consequently, when the processor clock frequency to bus clock frequency ratio is a whole integer, each rising edge of the bus clock signal $B_{CLK}$ is coincident with a rising edge of the processor clock signal $P_{CLK}$. Referring to FIG. 1A, a coincidence circuit 10 for providing the EVENB$_{CLK}$ signal, the signal designating the coincidence between the $P_{CLK}$ signal and the $B_{CLK}$ signal, according to the prior art, is shown. The coincidence circuit 10 includes a flip-flop unit 11 that has $P_{CLK}$ signal applied to the D terminal. The $B_{CLK}$ signal is applied to the clock terminal of flip-flop 11. The Q terminal of the flip-flop unit 11 is coupled to the D terminal of flip-flop unit 12 and to a first terminal of logic AND gate 13. The flip-flop unit 12 has the $P_{CLK}$ signals applied to the clock terminal. The Q terminal of flip-flop 12 is coupled to a second, inverting terminal of logic AND gate 13 and is coupled to a reset terminal of flip-flop unit 11. The output terminal of logic AND gate 13 is coupled to latch unit 14. The output signal of latch unit 14 is the $P_{CLK}$-$B_{CLK}$ leading edge coincident signal EVENB$_{CLK}$. The operation of the coincidence circuit can be understood with reference to FIG. 1B. In FIG. 1B, the relationship of the $B_{CLK}$ signal, the $P_{CLK}$ signal, and the EVENB$_{CLK}$ signal are shown for the configuration wherein the frequency of the $P_{CLK}$ signal is 3× the frequency of the $B_{CLK}$ signal. The dotted lines indicate the actual coincidence of the $B_{CLK}$ and the $P_{CLK}$ signals. The leading edge of the EVENB$_{CLK}$ signal is delayed half $P_{CLK}$ signal cycle and has a signal width of one $P_{CLK}$ signal cycle. As will be clear, this circuit relies on the alignment of the $B_{CLK}$ and the $P_{CLK}$ signal for proper operation. As a practical matter, the circuits that provide these signals are sensitive to noise and to component parameters that prevent the attainment of idealized waveforms. These factors can provide a phase shift in the processing system signals, the phase shift providing uncertainty with respect to the relationship of the leading edges of the signals. Referring to FIG. 2, the effect of these factors on the leading edge of the P signal is shown. The uncertainty in the leading edge of the $P_{CLK}$ signal as compared to the $B_{CLK}$ signal is shown by the shaded area in the $P_{CLK}$ signal and is designated as $\pm\Delta$. In addition, when the $P_{CLK}$ frequency is very much greater than the $B_{CLK}$ signal frequency, the half cycle time of $P_{CLK}$ signal can approach the magnitude of the phase error $\Delta$ and result in a lack of ability to generate accurately the EVENB$_{CLK}$ signal. An example of this difficulty is illustrated in FIG. 3. The leading edge of the $B_{CLK}$ signal leads the $P_{CLK}$ signal by a sufficient time that the flip-flop unit 11 of FIG. 1 is unable to sample properly the $P_{CLK}$ signal. At low $P_{CLK}$ frequencies, the inability to generate the EVENB$_{CLK}$ signal is less likely to occur because the $P_{CLK}$ cycle time is long enough to compensate for a relative phase shift between the $B_{CLK}$ signal and the $P_{CLK}$ signal. At high frequencies, the circuit is more prone to failure because the skew between the signals will remain fixed (in the best situation) as the $P_{CLK}$ cycle will become smaller.

In addition, when the processor clock signal frequency to bus clock signal frequency ratio is a half integer, then the alternating rising signal edges (such as even leading signal edges) of the bus clock signal are coincident with leading edges of the processor clock signal, and the remaining signal rising edges (such as the odd signal leading edges) of the bus clock signal are not coincident with signal rising edges of the processor clock signal.

SUMMARY OF THE INVENTION

A need has therefore been felt for a circuit generating the EVENB$_{CLK}$ signal having the feature that a logic signal or logic signals is/are generated in response to substantially coincident rising edges of a processor clock signal $P_{CLK}$ and a bus clock signal $B_{CLK}$ over a range of processor clock/bus clock frequency ratios that include whole integers and half integers. The EVENB$_{CLK}$ circuit would further have the feature that the circuit is not sensitive to the phase differences between the $P_{CLK}$ signal and the $B_{CLK}$ signal and would function at high values of the $P_{CLK}/B_{CLK}$ signal frequency ratios.

The aforementioned and other features are accomplished, according to the present invention, in a processing system wherein the bus clock signal $B_{CLK}$, having a frequency of F is applied to a phase-locked loop unit, the phase-locked loop unit being configured to generate processor clock signal $P_{CLK}$ having a frequency of N×F, where N is an integer or half integer greater than or equal to two. An $EVENB_{CLK}$ signal generating unit or coincidence unit has applied thereto a $P_{CLK}$ signal and a signal having an established phase relationship with the $B_{CLK}$ signal. In the preferred embodiment, the $P_{CLK}/M$ signal, the output signal from a divide-by-M unit (M=2N) in the phase-locked loop that is applied to the phase detector unit of the phase-locked loop, is applied to coincidence unit. When the $P_{CLK}$ signal and the $P_{CLK}/M$ signal are coincident, a rising edge of the $P_{CLK}$ signal is coincident with a rising edge of the $B_{CLK}$ signal and the $EVENB_{CLK}$ signal is generated. However, when N is an integer, a leading edge of the $P_{CLK}$ signal is coincident with a leading edge of $B_{CLK}$ signal between the generation of consecutive $P_{CLK}/M$ signals. In order to generate an $EVENB_{CLK}$ signal in the absence of a $P_{CLK}/M$ signal, each $P_{CLK}/M$ signal generates a signal in delay apparatus, a delayed signal being provided by the delay apparatus with an appropriate delay to substitute for the missing $P_{CLK}/M$ signal.

BRIEF DESCRIPTION OF THE DRAWINGS

The present invention may be better understood, and its numerous objects, features, and advantages made apparent to those skilled in the art by referencing the accompanying drawings.

FIG. 1A is a circuit diagram of the circuit for providing the $EVENB_{CLK}$ signal when coincident leading edges of the bus clock signal $B_{CLK}$ and the processor clock signal $P_{CLK}$ are detected according to the prior art, while

FIG. 5A is a circuit diagram of the counter circuit 411 of FIG. 4 according to the present invention, while

The use of the same reference symbols in different drawings indicates similar or identical items.

DESCRIPTION OF THE PREFERRED EMBODIMENT(S)

Detailed Description of the Drawings

Figure 1A:
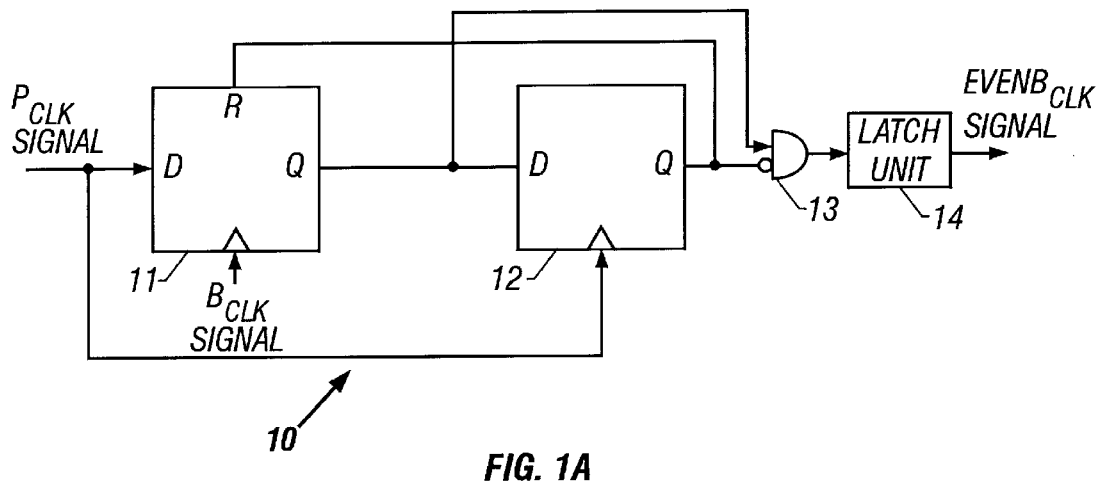
Figure 1B:
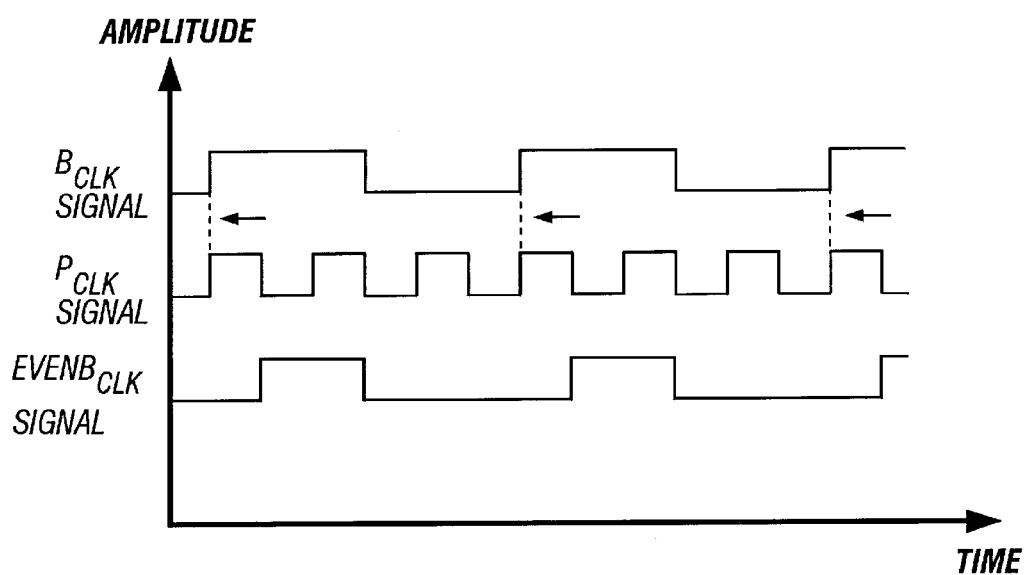
FIG. 1B illustrates the relationship between the bus clock signal $B_{CLK}$, the processor clock signal $P_{CLK}$ and the coincidence signal $EVENB_{CLK}$ of the circuit of FIG. 1A.
Figure 2:
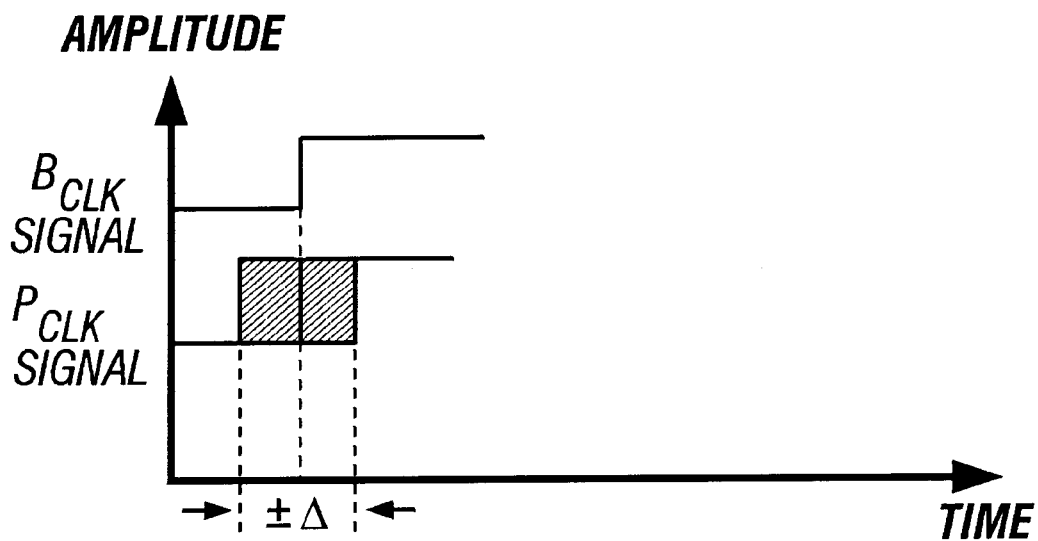
FIG. 2 illustrates a departure from the relationship between idealized waveforms resulting from noise in the apparatus found in physical implementations of the prior art circuits.
Figure 3:
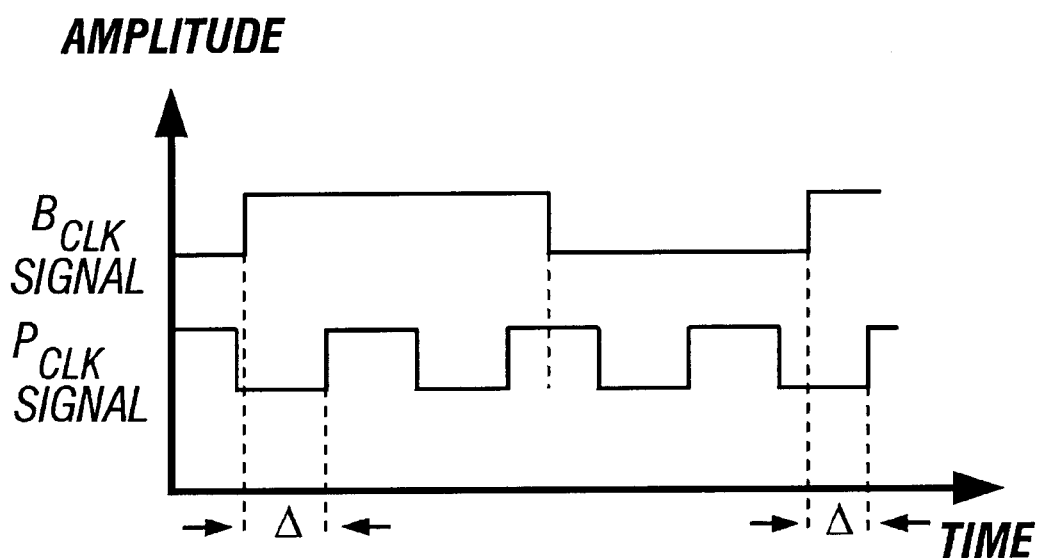
FIG. 3 illustrates how the departure from idealized waveforms can result in the failure of the prior art circuit for generating the $EVENB_{CLK}$ signal.
Figure 4:
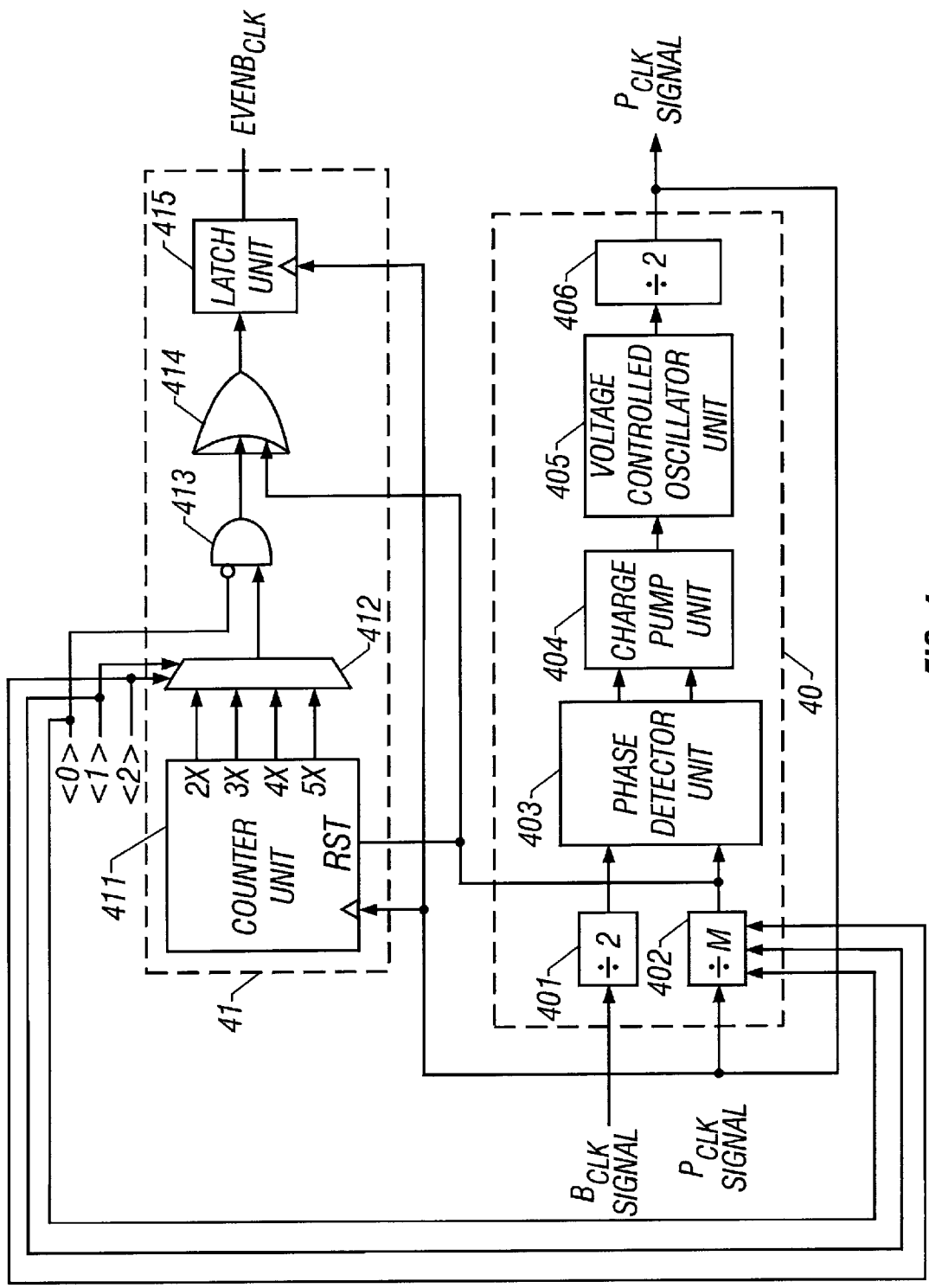
FIG. 4 is a circuit diagram of the apparatus for generating the $EVENB_{CLK}$ signal when the leading edges of the processor clock signal $P_{CLK}$ and the bus clock signal $B_{CLK}$ are coincident according to the present invention.

Referring to FIG. 4, the apparatus for generating an $EVENB_{CLK}$ signal, according to the present invention, is shown. The $P_{CLK}$ signal is applied to divide-by-M unit 402, to the clock terminal of counter unit 411, and to an inverting signal clock terminal of latch unit 415. The output terminal of the divide-by-M unit 402 is applied to a first input terminal of phase detector unit 403, to a reset (RST) terminal of counter 411 and to a first input terminal of logic OR gate 414. The $B_{CLK}$ signal is applied to a divide-by-2 unit 401. The output signal of the divide-by-2 unit 401 is applied to a second input terminal of phase detector 403.

TABLE 2

| <2> | <1> | <0> | M | N |
|---|---|---|---|---|
| 0 | 0 | 0 | 4 | 2 |
| 0 | 0 | 1 | 5 | 2.5 |
| 0 | 1 | 0 | 6 | 3 |
| 0 | 1 | 1 | 7 | 3.5 |
| 1 | 0 | 0 | 8 | 4 |
| 1 | 0 | 1 | 9 | 4.5 |
| 1 | 1 | 0 | 10 | 5 |
| 1 | 1 | 1 | 11 | 5.5 |

The output signal signals of the phase detector unit 403 are applied to a charge pump unit 404. The output signal of charge pump unit 404 is applied to an input terminal of voltage-controlled-oscillator unit 405. The output signal of the voltage-controlled-oscillator unit is applied to a divide-by-2 unit 406. The output signal of the divide-by-2 unit 406 is the $P_{CLK}$ signal. Counter unit 411 has 2x, 3x, 4x, and 5x output terminals. Each output terminal of counter unit 411 is applied to an associated input terminal of multiplexer 412. The multiplexer unit 412 receives control signals <1> and <2>. The output signal from multiplexer 412 is applied to a first input terminal of logic AND gate 413. A control signal <0> is applied to a second inverting signal input terminal of logic AND gate 413. The output signal of logic AND gate 413 is applied to a second input terminal of logic OR gate 414. The output signal of logic OR gate 414 is applied to the D terminal of latch unit 415. The Q terminal of latch unit 415 has the signal $EVENB_{CLK}$ applied thereto. The relationship of the control signals <0>, <1>, and <2> and the value of N, the ratio of the $P_{CLK}$ signal frequency to the $B_{CLK}$ signal frequency, is shown in Table 2.

Figure 5A:
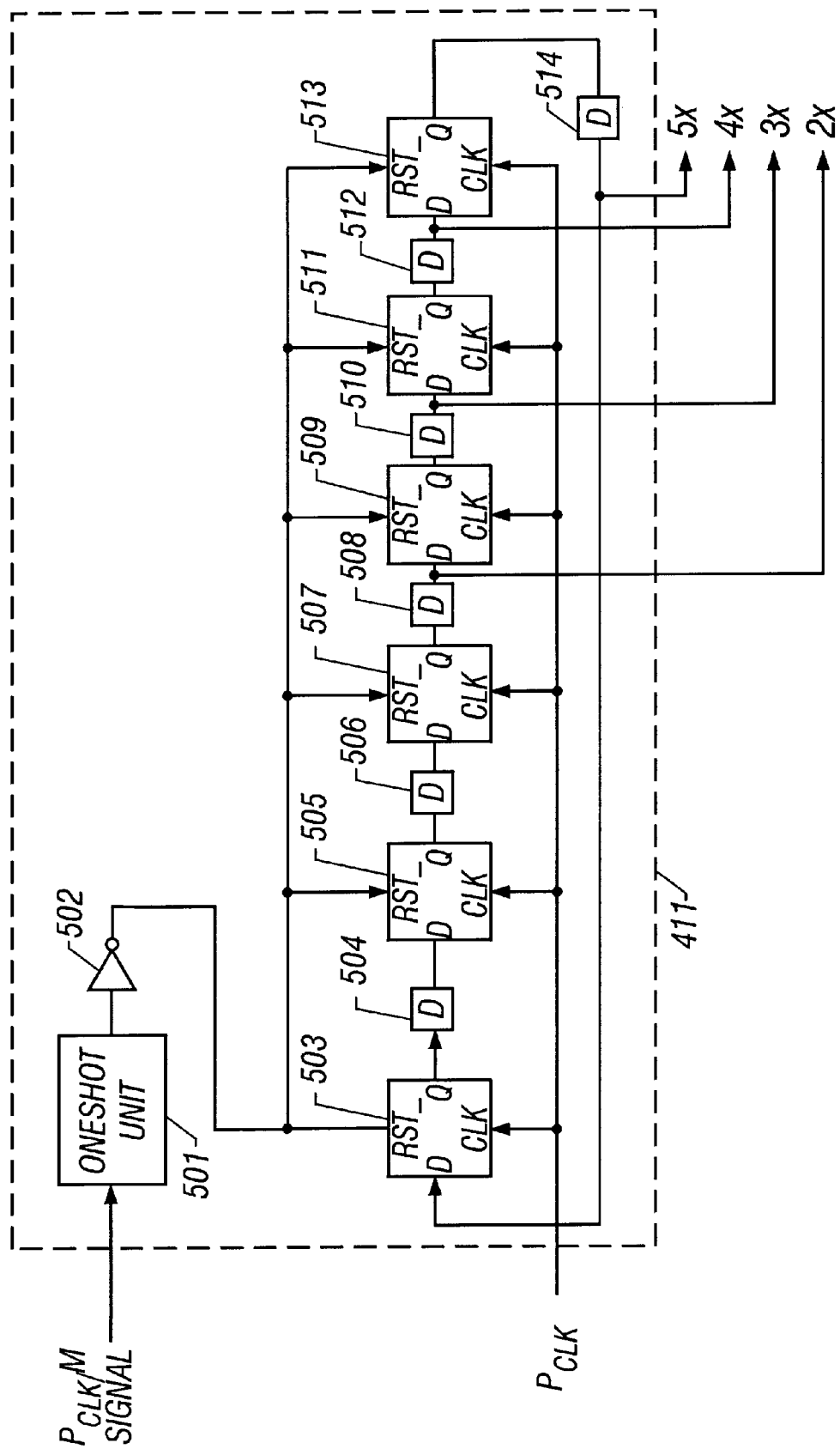

Referring to FIG. 5A, the circuit diagram for the counter unit 411, according to the preferred embodiment of the present invention, is shown. The $P_{CLK}/M$ signal is applied to an input terminal of a one-shot unit 501. The output signal of the one-shot unit 501 is applied, through inverting amplifier 502, to the RST_ (reset-not) terminals of D-type flip-flop units 503, 505, 507, 509, 511, and 513. The $P_{CLK}$ signal is applied to the CLK (clock) terminals of D-type flip-flop units 503, 505, 507, 509, 511, and 513. The output signal applied to the Q (data output) terminal of D-type flip-flop unit 503 is applied, through delay line 504, to the D (data input) terminal of D-type flip-flop unit 505. The Q terminal of D-type flip-flop unit 505 is applied, through delay line 506, to the D terminal of D-type flip-flop unit 507. The signal applied to the Q terminal of D-type flip-flop unit 507 is applied, through delay line 508, to a D terminal of D-type flip-flop unit 509 and to the frequency 2x terminal. The signal applied to the Q terminal of D-type flip-flop unit 509 is applied, through delay line 510, to a D terminal of D-type flip-flop unit 511 and to a frequency 3x terminal. The signal applied to the Q terminal of D-type flip-flop unit 511 is applied, through delay line 512, to a D terminal of D-type flip-flop unit 513 and to a frequency 4x terminal. The signal applied to the Q terminal of D-type flip-flop unit 513 is applied, through delay line 514, to a D terminal of D-type flip-flop unit 503 and to a frequency 5x terminal.

Figure 5B:
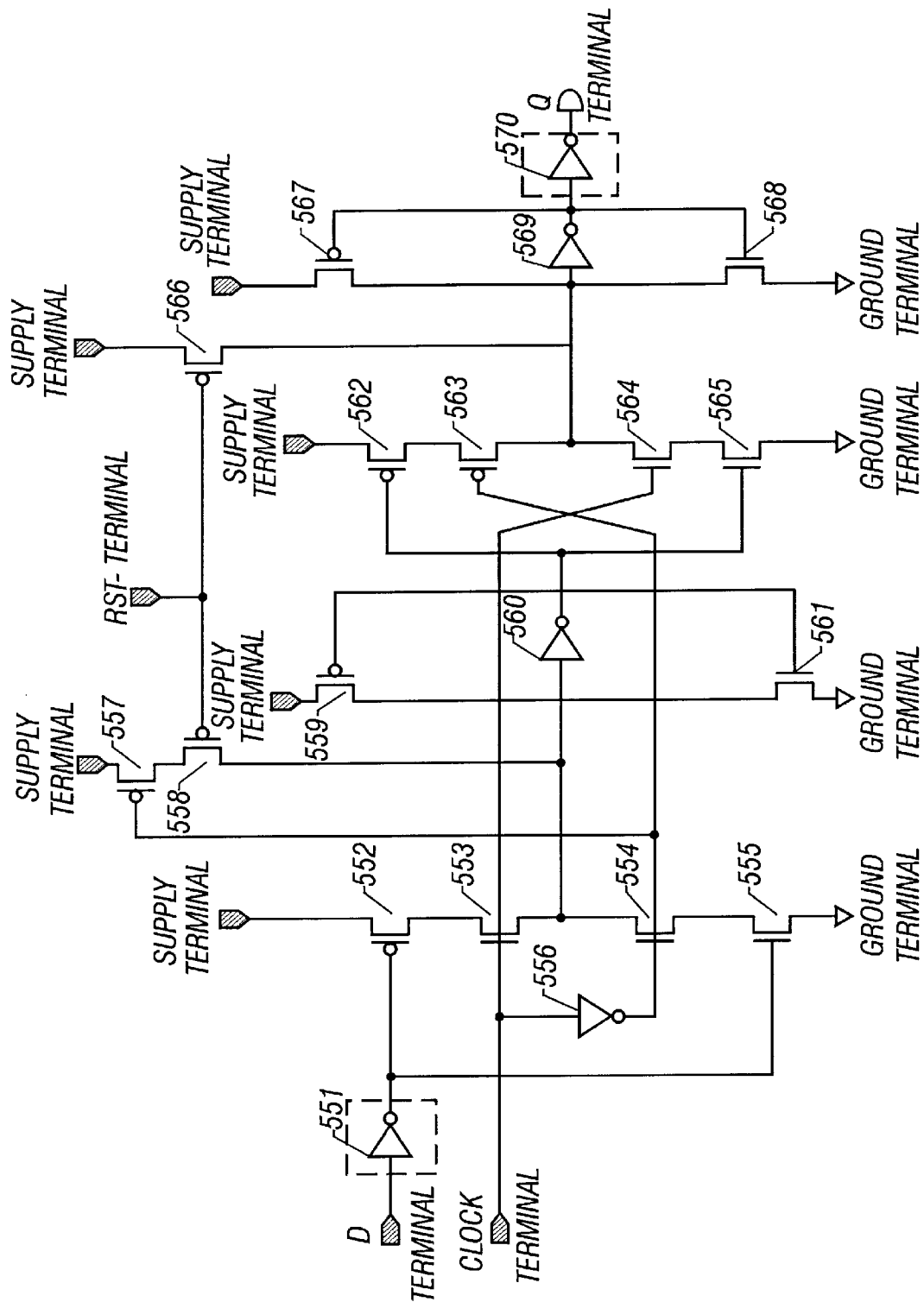
FIG. 5B is a circuit diagram of a D-type flip-flop unit used in the circuit of FIG. 5A.

Referring to FIG. 5B, a circuit diagram of the flip-flop units 503, 505, 507, 509, 511, and 513 is shown. A D terminal is coupled to an input terminal of an inverting amplifier 551. The output terminal of inverting amplifier 551 is coupled to a gate terminal of p-type metal oxide, field effect transistor (MOSFET) 552 and to a gate terminal of n-type MOSFET 555. A first source/drain terminal of transistor 552 is coupled to a supply terminal, while a second source/drain terminal of transistor 552 is coupled to a first source/drain terminal of p-type MOSFET 553. A clock terminal is coupled to a gate terminal of transistor 553, to an input terminal of inverting amplifier 556 and to a gate terminal of n-type transistor 564. A second source/drain terminal of transistor 553 is coupled to a first source/drain terminal of n-type MOSFET 554, to a first source/drain terminal of p-type MOSFET 558, to a first source/drain terminal of p-type MOSFET 559, to an input terminal of inverting amplifier 560, and to first source/drain terminal of n-type MOSFET 561. An output terminal of inverting amplifier 556 is coupled to a gate terminal of transistor 554, to a gate terminal of p-type MOSFET 557, and to a gate terminal of p-type MOSFET 563. A second source/drain terminal of transistor 554 is coupled to a first source/drain terminal of transistor 555, while a second source/drain terminal of transistor 555 is coupled to ground. A first source/drain terminal of transistor 557 is coupled to the supple terminal, while a second source/drain terminal of transistor 557 is coupled to a second source/drain terminal of transistor 558. A second source/drain terminal of transistor 559 is coupled to the supply terminal. A second source/drain terminal of transistor 561 is coupled to the ground terminal. The output terminal of inverting amplifier 560 is coupled to a gate terminal of transistor 559, to a gate terminal of transistor 561, to a gate terminal of p-type MOSFET 562, and to a gate terminal of n-type MOSFET 565. A first source/drain terminal of transistor 562 is coupled to the supply terminal, while a second source/drain terminal of transistor 562 is coupled to a first source/drain terminal of transistor 563. A second source/drain terminal of transistor 563 is coupled to a first source/drain terminal of transistor 564, to a first source drain terminal of p-type MOSFET 566, to a first source/drain terminal of p-type MOSFET 567, to a first source/drain terminal of n-type MOSFET 568, and to an input terminal of inverting amplifier 569. A second source/drain terminal of transistor 564 is coupled to a first source/drain terminal of transistor 565, while a second source/drain terminal of transistor 565 is coupled to the ground terminal. The RST_ (reset not) terminal is coupled to a gate terminal of transistor 558 and to a gate terminal of transistor 566. A second source/drain terminal of transistor 566 is coupled to the supply terminal. The output terminal of inverting amplifier 569 is coupled to an input terminal of inverting amplifier 570, to a gate terminal of transistor 567, and to a gate terminal of transistor 568. A second source/drain terminal of transistor 567 is coupled to the supply terminal, while the second terminal of transistor 568 is coupled to the ground terminal. The output terminal of inverting amplifier 570 is coupled to the Q terminal of the D type flip-flop unit. The inverting amplifiers 551 and 570, are shown enclosed by dotted lines in FIG. 5B. Inverting amplifiers 551 and 570 are present only in flip-flop unit 503, the first flip-flop unit of the series and serve the following purpose. When inverting amplifiers 551 and 570 are present in the flip-flop unit 503, then when the reset terminal RST_ has a logic 0 signal applied thereto, the output terminal Q will have a logic 1 signal applied thereto. When, as in the flip-flop units 505, 507, 509, 511, and 513, the inverting amplifiers 551 and 570 are not present, then the application of a logic 0 applied to reset terminal RST_ will result in a logic 0 signal being applied to the Q terminal of the flip-flop circuit.

Figure 6:
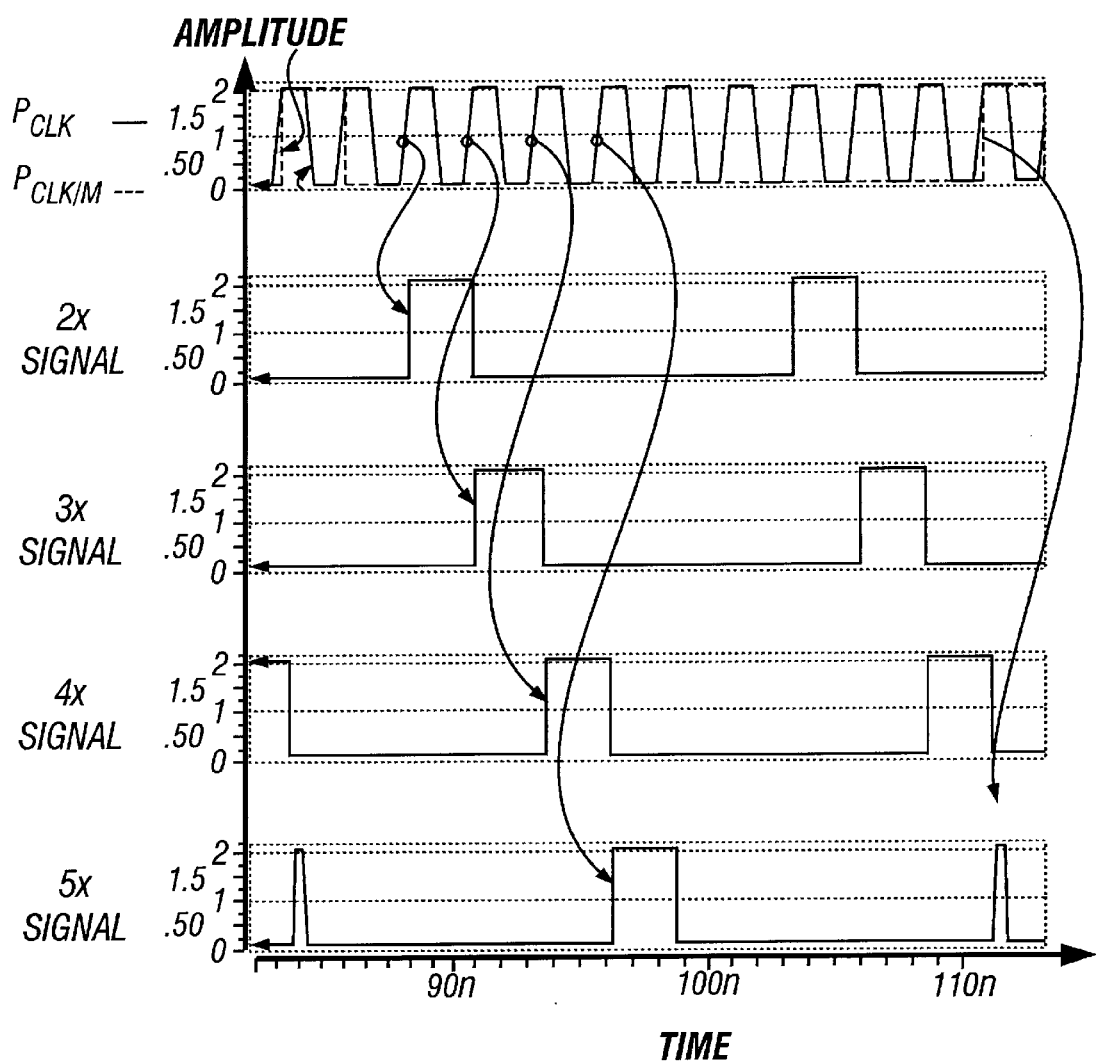
FIG. 6 illustrate the relationship of the input signals and the output signals of the counter circuit of FIG. 5.

Referring now to FIG. 6, the relationship of the output signals to the input signals of the counter circuit of FIG. 5A are shown. In FIG. 6, the upper diagram displays the $P_{CLK}$ signal and the $P_{CLK}/M$ signal (i.e., with dotted lines). The $P_{CLK}/M$ is stepped through the stages of the counter. Note that the 2x designation of a terminal of the counter unit indicates a delay of 2 $P_{CLK}$ signal cycles from the coincident leading edges of the $P_{CLK}$ signal and the $P_{CLK}/M$ signal to the application of the delayed signal to the terminal. The 3x, 4x, and 5x terminals of the counter unit indicate 3, 4, and 5 $P_{CLK}$ signal cycles delay, respectively for the signals applied to the terminals.

Figure 7A:
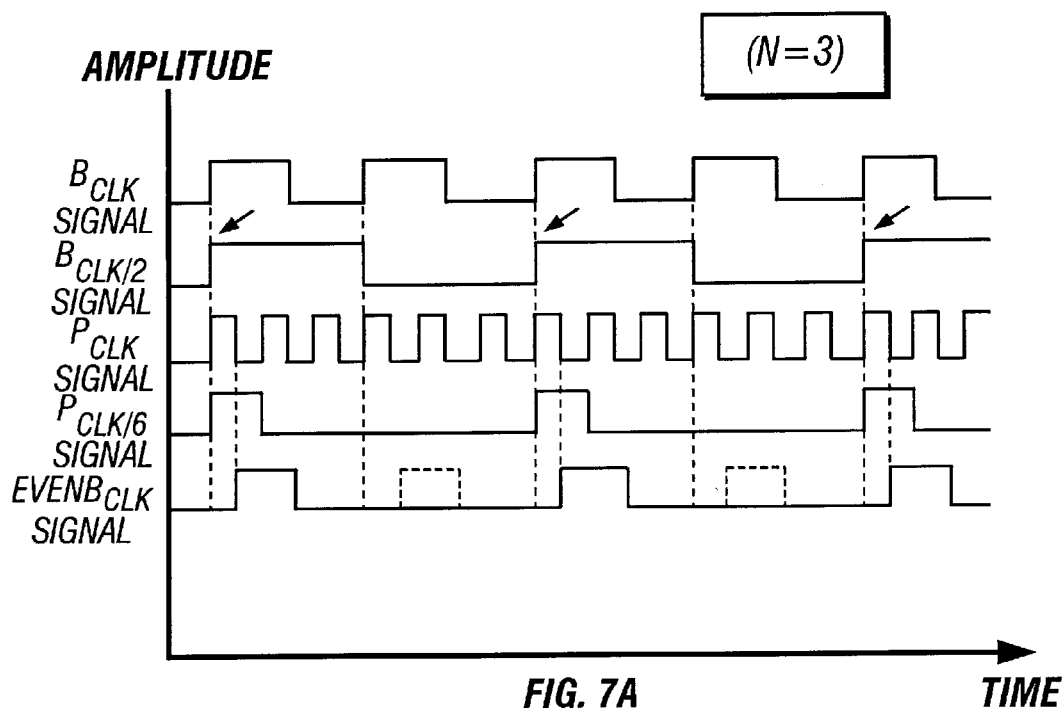
FIG. 7A and FIG. 7B illustrate why different apparatus is needed to generate the $EVENB_{CLK}$ signals when N has an integer value compared to when N has a half integer value.
Figure 7B:
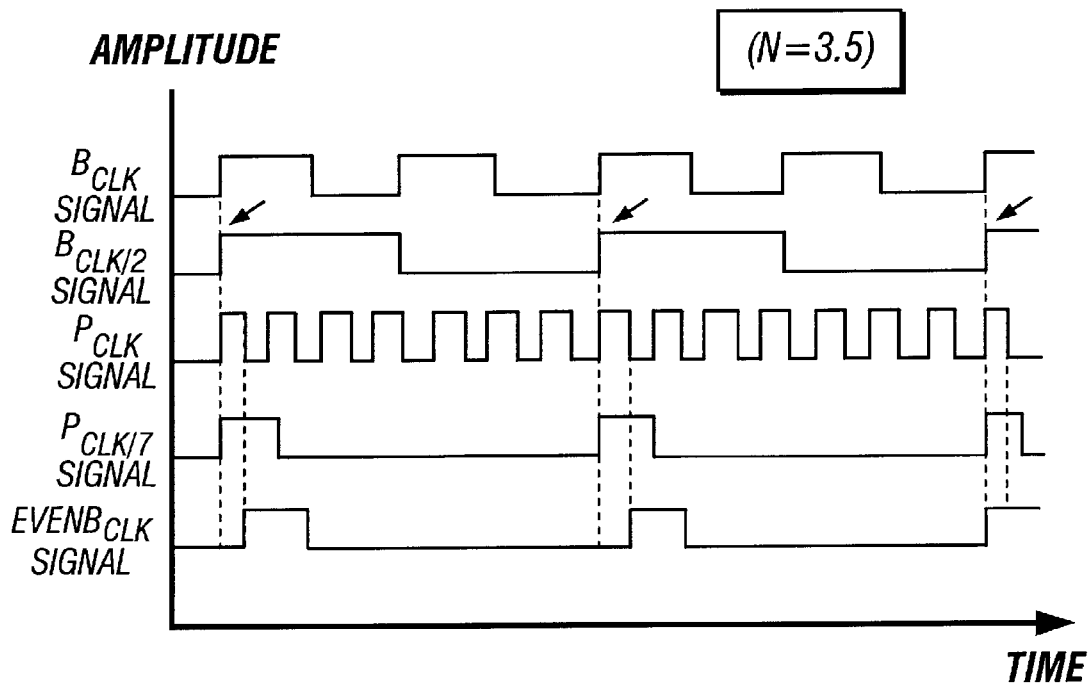

Referring to FIG. 7A, FIG. 7A illustrates the relationship of the $B_{CLK}$ signal, the $B_{CLK}/2$ signal, the $P_{CLK}$ signal and the $P_{CLK}/M$ signal when the processor clock signal has a frequency 3x the bus clock signal frequency, i.e., N=3, M=6. Referring to FIG. 7B, the frequency of the $P_{CLK}$ signal is 3.5x the frequency of the $B_{CLK}$ signal, i.e., N=3.5, M=7. In each Figure, arrows designate when the $P_{CLK}$ signal, the $B_{CLK}$ signal and the $P_{CLK}/M$ signal all have coincident leading edges and an $EVENB_{CLK}$ signal is generated (i.e., with a half $P_{CLK}$ cycle delay as a result of the latch unit). In FIG. 7B, every time the $B_{CLK}$ signal and the $P_{CLK}$ signal have coincident leading edge, the $P_{CLK}/M$ signal has a leading edge and an $EVENB_{CLK}$ signal is generated. In FIG. 7A, however, half of the coincidences between the leading edges of the $P_{CLK}$ signal and the $B_{CLK}$ signal do not have coincident $P_{CLK}/M$ signal leading edges. The missing $EVENB_{CLK}$ signals are shown as dotted lines on the profile of the $EVENB_{CLK}$ signal.

Operation of the Preferred Embodiment

The purpose of the present invention is to provide an $EVENB_{CLK}$ signal every time that the rising edge of the $P_{CLK}$ signal and the rising edge of the $B_{CLK}$ signal are coincident. The $B_{CLK}$ signal and the $P_{CLK}$ signal can have a phase relationship that complicates the determination of the signal rising edge coincidence, two signals in the processor are required that have fixed relationships to the $P_{CLK}$ signal and the $B_{CLK}$ signal. The $P_{CLK}$ signal from the output of the phase-locked loop can provide one signal for application to the coincidence unit. The second signal applied to the coincidence unit in the present invention is the $P_{CLK}/M$ signal, i.e., the output signal of the divide-by-M unit. The $P_{CLK}/M$ signal is applied to the phase detection unit of the phase-locked loop. The other input signal applied to the phase-locked loop is the output signal from the divide-by-2 unit, a signal related in phase to the $B_{CLK}$ signal. Consequently, the $P_{CLK}/M$ signal has a determined phase relationship to the $B_{CLK}$ signal.

The use of the $P_{CLK}/M$ signal for use with the coincidence circuit is satisfactory when N has a half integer value. As can be seen from FIG. 7B, every rising edge of the $P_{CLK}/M$ signal is coincident with a simultaneous rising edge of the $P_{CLK}$ signal and the $B_{CLK}$ signal. However, as can be seen from FIG. 7A, when N has an integer value, the rising edge of the $P_{CLK}/M$ signal is present only for alternate coincident rising edges of the $B_{CLK}$ signal and the $P_{CLK}$ signal. (The missing $EVENB_{CLK}$ signals are shown with dotted lines in FIG. 7A.) The coincidence circuit of the present invention must therefore generate an $EVENB_{CLK}$ signal in the absence of a rising edge of a $P_{CLK}/M$ signal.

The operation of the present invention can be understood as follows. The circuit 40 of FIG. 4 is a phase-locked loop and is implemented to generate the PCLK signal by the frequency multiplication of the $B_{CLK}$ signal. The phase-locked loop circuit, as indicated above, provides the $P_{CLK}$ and the $P_{CLK}/M$ signals used to generate the $EVENB_{CLK}$ signals in the coincidence circuit. When the frequency of the $P_{CLK}$ signal is a half integer multiple of the frequency of the $B_{CLK}$ signal, a rising edge of the $P_{CLK}/M$ is present for every coincidence of the rising edges of the $P_{CLK}$ signal and the $B_{CLK}$ signal. In the present invention, when the half integer condition is present, the control signal <0> is a logic 1 (cf. Table 2). Referring to FIG. 4, the logic 1 <0> control signal is applied to the inverting terminal of logic AND gate 413. The output terminal of logic AND gate applies a logic 0 signal to one of the input terminals of logic OR gate 414. Therefore, the signal applied to the second input terminal of logic OR gate, $P_{CLK}/M$, is transmitted therethrough. Consequently, the $P_{CLK}/M$ signal is applied to the input terminal of latch 415. The $P_{CLK}$ signal is applied to the clock terminal of latch 415. The coincident of the application of the $P_{CLK}$ signal and the $P_{CLK}/M$ signal to the latch circuit 415 results in the generation of the $EVENB_{CLK}$ signal. When the frequency of the $P_{CLK}$ signal is an integer multiple of the $B_{CLK}$ signal, as pointed out previously, the $P_{CLK}/M$ signal does not provide a leading edge that is coincident with every leading edge of the $B_{CLK}$ signal, but rather alternate leading edges of the $B_{CLK}$ signal are coincident with a leading edge of the $P_{CLK}/M$ signal. The present invention provides that when N is an integer, for those instances when the $P_{CLK}/M$ signal and the $P_{CLK}$ signal are present simultaneously, the PCLK/M signal is transmitted by logic OR gate 414 and applied to latch unit 415. The application of the $P_{CLK}$ signal to the clock terminal of latch unit 415 results in the generation of the $EVENB_{CLK}$ signal. In addition, the $P_{CLK}/M$ signal is applied to the counter unit and, more specifically to the one shot unit in the counter unit (shown in FIG. 5A). The response of the one shot unit to the leading edge of the $P_{CLK}/M$ unit is to generate a pulse signal. The pulse signal is applied (through an inverting amplifier) to the reset terminals of flip-flops 503, 505, 507, 509, 511, and 513. The pulse signal stores a logic 1 signal in flip-flop unit 503 and resets the remaining flip-flop unit of the counter circuit 41 to zero. In response to each $P_{CLK}$ signal applied to the clock terminals of the flip-flop units, the signal stored in the first flip-flop unit (503) by the pulse signal, is transferred to the next successive flip-flop unit. The stored signal is applied, on successive $P_{CLK}$ cycles, to the 2x, 3x, 4x, and 5x terminals of the counter after a one cycle delay. The multiplexer, in response to control signals, determines which counter terminal is coupled to the logic AND gate. The signal applied to the output terminal is applied through the logic AND gate and the logic OR gate where, in coincidence with a $P_{CLK}$ signal, an $EVENB_{CLK}$ signal is generated. Expressed in a different manner, the counter unit, in response to a $P_{CLK}/M$ signal, stores a signal. The signal stored in the counter is applied to a series of terminals, the signal at each terminal being delayed by width of the $P_{CLK}$ cycle. A multiplexer, in response to control signals <1> and <2>, transmits the delayed signal at such a time as to an $EVENB_{CLK}$ signal that coincides with a rising edge of a $P_{CLK}$ signal and a rising edge of a $B_{CLK}$ signal, but does not coincide with a rising edge of a $P_{CLK}/M$ signal.

Those skilled in the art will readily implement the steps necessary to provide the structures and the methods disclosed herein, and will understand that the process parameters, materials, dimensions, and sequence of steps are given by way of example only and can be varied to achieve the desired structure as well as modifications that are within the scope of the invention. Variations and modifications of the embodiments disclosed herein may be made based on the description set forth herein, without departing from the spirit and scope of the invention as set forth in the following claims.

What is claimed is:

1. A circuit for generating an $EVENB_{CLK}$ signal indicating a coincidence between a leading edge of a processor clock signal $P_{CLK}$ and a leading edge of a bus clock signal $B_{CLK}$, the circuit comprising:
    a phase-locked loop unit, the phase-locked loop unit responsive to the $B_{CLK}$ signal for providing a $P_{CLK}$ signal having a frequency N times a frequency of the $B_{CLK}$ signal frequency, wherein N can be an integer or half integer value; and
    a coincidence unit responsive to the $P_{CLK}$ signal and a signal from the phase-locked loop unit having phase relationship with the $B_{CLK}$ signal for generating the $EVENB_{CLK}$ signal.

2. The circuit of claim 1 wherein the signal from the phase-locked loop unit is a signal applied to a phase detector component of the phase-locked loop unit.

3. The circuit of claim 2 wherein the phase-locked loop unit includes:
    a divide-by-M unit where $M=2\times N$, the divide-by-M unit having the $P_{CLK}$ signal applied to an input terminal, the output signal of the divide-by-M unit, the $P_{CLK}/M$ signal, being the signal from the phase-locked-loop unit applied to the coincidence unit.

4. The circuit of claim 3 wherein the coincidence unit generates an $EVENB_{CLK}$ signal when a $P_{CLK}$ signal coincides with a $P_{CLK}/M$ signal.

5. The circuit of claim 4 wherein the coincidence unit has a first and second mode of operation, the first mode of operation generating the $EVENB_{CLK}$ signal the $P_{CLK}/M$ signal is coincident with a $P_{CLK}$ signal, a second mode of operation when the $P_{CLK}$ signal and the $B_{CLK}$ signal have coincident rising edges, but no $P_{CLK}/M$ signal is present.

6. The circuit of claim 5 wherein the coincidence unit includes a delay unit, the delay unit storing a stored signal in response to the $P_{CLK}/M$ signal, the delay unit providing a delayed stored signal with a predetermined delay, the delayed stored signal replacing the $P_{CLK}/M$ signal in the second mode of operation.

7. The circuit of claim 6 wherein the delay unit of the coincidence unit includes a counter unit and a gate unit.

8. The circuit of claim 7 wherein the counter unit has a plurality of flip-flop units coupled in series, wherein the $P_{CLK}$ signal is applied to the clock terminals of the flip-flop units, $P_{CLK}$ signal causing the stored signal to be transferred to the next consecutive flip-flop unit, wherein the delay of the delayed stored signal is determined by the flip-flop unit in which the stored signal is stored.

9. The circuit of claim 8, the gate unit having the output terminals from a plurality of flip-flop units coupled to input terminals of the gate unit, the gate unit responsive to control signals for determining the delay of the delayed stored signal applied to an output terminal of the gate.

10. The circuit of claim 9 wherein the coincidence unit include a latch unit, the latch unit having the $P_{CLK}$ signal, the $P_{CLK}/M$ signal and the delayed stored signal applied thereto, the latch unit providing an $EVENB_{CLK}$ signal in response to the simultaneous application of $P_{CLK}/M$ signal and the $P_{CLK}$ signal thereto, the latch unit providing an $EVENB_{CLK}$ signal in response to a simultaneous application of the $P_{CLK}$ signal and the delayed stored signal thereto.

11. A clock circuit for use in a processor unit of a data processing system, the clock circuit comprising:
    a frequency multiplier unit responsive to a bus clock, $B_{CLK}$, signal having a frequency F, said frequency multiplier unit generating a $P_{CLK}$ clock signal having frequency $N\times F$ where N is an integer or a half integer, the frequency multiplier unit including an input unit responsive to the $P_{CLK}$ signal, the input unit providing a $P_{PRO}$ signal, the $P_{PRO}$ signal being an established phase relationship with the $B_{CLK}$ signal;

coincidence unit responsive to the $P_{PRO}$ signal and the $P_{CLK}$ signal for generating an $EVENB_{CLK}$ signal when the $P_{PRO}$ signal and the $P_{CLK}$ signal have a predetermined temporal relationship; and a delay unit responsive to $P_{PRO}$ signal for storing a $P_{PRO}'$ signal, the delay unit providing a delayed $P_{PRO}'$ signal to the coincidence unit having a preselected delay, the coincidence unit being responsive to a delayed $P_{PRO}'$ signal when a $P_{PRO}$ signal does not have the predetermined temporal relationship.

12. The clock circuit of claim 11 wherein a clock for the delay unit is provided by the $P_{CLK}$ signal.

13. The clock circuit of claim 12 wherein the coincidence unit is a latch unit, the $P_{PRO}$ signal and the $P_{PRO}'$ signal being applied to the input terminal of the latch unit, the $P_{CLK}$ signal being applied to a clock terminal of the latch unit.

14. The clock circuit of claim 13 wherein the frequency multiplier unit is a phase-locked loop.

15. The clock circuit of claim 14 wherein the input unit is a divide-by-M unit, M being equal to 2×N, and wherein the $P_{PRO}$ signal is an output signal from the divide-by-M unit, the $P_{CLK}/M$ signal.

16. The clock circuit of claim 15 wherein the delay unit is a counter unit.

17. The clock circuit of claim 16 wherein the counter unit includes a plurality of flip-flop units.

18. The clock unit of claim 17 wherein the $EVENB_{CLK}$ signal is generated when the $B_{CLK}$ signal and the $P_{CLK}$ signal have coincident leading edges.

19. The clock unit of claim 18 wherein when the $P_{CLK}/M$ signal and the $P_{CLK}$ signal have coincident leading edges, the $P_{CLK}$ signal and the $B_{CLK}$ signal have coincident leading edges.

20. The clock circuit of claim 19 wherein, when the $P_{CLK}$ signal and the $B_{CLK}$ signal have coincident leading edges and the $P_{CLK}/M$ signal does not have a coincident leading edge, a delayed $P_{CLK}/M'$ signal is applied to the latch unit to provide the $EVENB_{CLK}$ signal.

21. The clock unit of claim 20 wherein the delay of the $P_{CLK}/M'$ is determined by control signals, the delay being N $P_{CLK}$ cycles when N is an integer, coincident leading edges of $P_{CLK}$ signal and the $P_{CLK}/M$ signal being coincident with all leading edges of a $B_{CLK}$ signal when N is a half integer.

22. In a data processing system, a method for generating a signal $EVENB_{CLK}$ indicative of a leading edge coincidence of a processor clock ($P_{CLK}$) signal and a bus clock ($B_{CLK}$) signal, wherein the $P_{CLK}$ signal has frequency of N×F where F is a frequency of the $B_{CLK}$ signal and wherein N can be an integer or a half integer, the $P_{CLK}$ signal is generated in the processor, the method comprising:

generating the $P_{CLK}$ signal in the processor in response to the $B_{CLK}$ signal;

generating a clock ($P_{PRO}$) signal in the processor unit having an established relationship with the $B_{CLK}$ signal; and determining the coincidence of the $P_{CLK}$ signal and the $B_{CLK}$ signal from the $P_{CLK}$ signal and the $P_{PRO}$ signal.

23. The method of claim 22 wherein determining the coincidence includes: applying the $P_{PRO}$ signal and the $P_{CLK}$ signal to a coincidence circuit; and generating the $EVENB_{CLK}$ signal by the coincidence circuit.

24. The method of claim 23 wherein the generating of the $P_{CLK}$ signal includes:

generating the $P_{CLK}$ signal with a phase-locked loop.

25. The method of claim 24 wherein the phase-locked loop includes a divide-by-M unit receiving the $P_{CLK}$ signal at an input terminal and applying an output signal $P_{CLK}/M$ to a phase detector unit of the phase locked loop, therein the $P_{CLK}/M$ signal is the $P_{PRO}$ signal.

26. The method of claim 25 wherein the applying the $P_{PRO}$ and the $P_{CLK}$ signal include:

applying the $P_{CLK}/M$ signal to an input terminal of a latch unit; and applying the $P_{CLK}$ signal to a clock terminal of the latch unit.

27. The method of claim 26 wherein, when leading edge of a $B_{CLK}$ signal coincides with a leading edge of a $P_{CLK}$ signal and not with a leading edge of a $P_{CLK}/M$ signal:

delaying a $P_{CLK}/M$ signal until the delayed $P_{CLK}/M$ signal has a leading edge coincident with the leading edges of the $P_{CLK}$ and $B_{CLK}$ signals; and applying the delayed $P_{CLK}/M$ signal to an input terminal of the latch unit.

28. The method of claim 22 wherein, when a leading edge of the $B_{CLK}$ signal coincides with a leading edge of a of $P_{CLK}$ signal and not with the leading edge of a $P_{PRO}$ signal:

delaying a $P_{PRO}$ signal until the delayed $P_{PRO}$ signal has a leading edge coincident with the $B_{CLK}$ signal; and applying the delayed $P_{PRO}$ signal to the input terminal of the coincidence unit.

29. The method of claim 28 where delaying a $P_{CLK}/M$ signal includes:

applying the $P_{CLK}$ signal to a counter unit, the counter unit including a plurality of flip-flop units;

transferring the applied $P_{CLK}/M$ signal from flip-flop unit to a next flip-flop unit at a rate determined by the $P_{CLK}$ signal; and applying a preselected flip-flop unit output signal to the latch unit.

30. The method of claim 29 wherein the delay of the applied $P_{CLK}/M$ signal is N $P_{CLK}$ cycles.

31. The method of claim 29 wherein applying a selected flip-flop unit output unit includes:

applying output signals from the flip-flop unit to input terminals of a multiplexer unit; and selecting a flip-flop unit output signal to applied to the latch unit by control signals applied to the multiplexer unit.

* * * * *